(12) United States Patent
Xu

(10) Patent No.: US 12,125,843 B2
(45) Date of Patent: *Oct. 22, 2024

(54) ELECTROSTATIC DISCHARGE PROTECTION DEVICE

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 429 days.

This patent is subject to a terminal disclaimer.

(21) Appl. No.: 17/643,274

(22) Filed: Dec. 8, 2021

(65) Prior Publication Data

US 2023/0019523 A1    Jan. 19, 2023

Related U.S. Application Data

(63) Continuation of application No. PCT/CN2021/113179, filed on Aug. 18, 2021.

(30) Foreign Application Priority Data

Jul. 16, 2021 (CN) .......................... 202110808125.7

(51) Int. Cl.
*H01L 27/02* (2006.01)

(52) U.S. Cl.
CPC ........ *H01L 27/027* (2013.01); *H01L 27/0255* (2013.01); *H01L 27/0288* (2013.01); *H01L 27/0292* (2013.01)

(58) Field of Classification Search
CPC .............. H01L 27/027; H01L 27/0255; H01L 27/0288; H01L 27/0292
See application file for complete search history.

(56) References Cited

U.S. PATENT DOCUMENTS 7,601,991 B2 * 10/2009 Salcedo ............. H01L 29/7436
257/173
9,831,666 B2   11/2017 Parthasarathy et al.
(Continued)

FOREIGN PATENT DOCUMENTS

CN    102315212 A  *  1/2012
CN    102315258 A     1/2012
(Continued)

OTHER PUBLICATIONS

Translation of CN-104835818-B (Year: 2019).*
(Continued)

*Primary Examiner* — Herve-Louis Y Assouman
*Assistant Examiner* — Linda J. Fleck
(74) *Attorney, Agent, or Firm* — Kilpatrick Townsend & Stockton LLP

(57) ABSTRACT

The present disclosure provides an electrostatic protection device, and relates to the technical field of semiconductors. The electrostatic discharge protection device includes a first P-type heavily-doped region, a first N-type heavily-doped region, a second N-type heavily-doped region, a second P-type heavily-doped region, and a third N-type heavily-doped region. The first P-type heavily-doped region and the first N-type heavily-doped region are located in a P well, the second P-type heavily-doped region and the third N-type heavily-doped region are located in a first N well, one part of the second N-type heavily-doped region is located in the P well, the other part of the second N-type heavily-doped region is located in first N well, and the P well and the first N well are adjacent to each other and both located in the P-type substrate.

12 Claims, 2 Drawing Sheets

(56) References Cited

U.S. PATENT DOCUMENTS

| | | | |
|---|---|---|---|
| 10,504,886 B1* | 12/2019 | Yam | H01L 27/027 |
| 2005/0242400 A1 | 11/2005 | Cheng et al. | |
| 2007/0007545 A1* | 1/2007 | Salcedo | H01L 27/0262 |
| | | | 257/127 |
| 2012/0161216 A1* | 6/2012 | Liang | H01L 27/0285 |
| | | | 257/296 |
| 2014/0027815 A1* | 1/2014 | Su | H01L 29/7436 |
| | | | 257/E21.608 |
| 2017/0170167 A1* | 6/2017 | Jang | H01L 29/7408 |
| 2018/0012961 A1 | 1/2018 | Aharoni | |
| 2019/0371786 A1* | 12/2019 | ChenHsu | H01L 29/0649 |
| 2023/0017089 A1* | 1/2023 | Xu | H01L 29/87 |

FOREIGN PATENT DOCUMENTS

| | | | | |
|---|---|---|---|---|
| CN | 104835818 A | * | 8/2015 | |
| CN | 105428354 A | | 3/2016 | |
| CN | 106158849 A | | 11/2016 | |
| CN | 108735732 A | | 11/2018 | |
| CN | 108389891 B | | 3/2019 | |
| CN | 104835818 B | * | 9/2019 | |
| CN | 110323207 A | * | 10/2019 | H01L 22/34 |
| CN | 111933639 A | | 11/2020 | |

OTHER PUBLICATIONS

CN 102315212 A, merged English translation and original Chinese patent (Year: 2012).*

CN 104835818 A, merged English translation and original Chinese patent (Year: 2015).*

CN 110323207 A, merged English translation and original Chinese patent (Year: 2019).*

International Search Report cited in PCT/CN2021/113179, mailed Apr. 13, 2022, 9 pages.

* cited by examiner

ELECTROSTATIC DISCHARGE PROTECTION DEVICE

CROSS-REFERENCE TO RELATED APPLICATIONS

This is a continuation of International Application No. PCT/CN2021/113179, filed on Aug. 18, 2021, which claims the priority to Chinese Patent Application No. 202110808125.7, titled "ELECTROSTATIC DISCHARGE PROTECTION DEVICE" and filed with the China National Intellectual Property Administration (CNIPA) on Jul. 16, 2021. The entire contents of International Application No. PCT/CN2021/113179 and Chinese Patent Application No. 202110808125.7 are incorporated herein by reference.

TECHNICAL FIELD

The present disclosure relates but not only to an electrostatic discharge protection device.

BACKGROUND

Electro static discharge (ESD) is one of factors affecting reliability of integrated circuits (ICs). From chip manufacturing to production assembly, from product transportation to daily use, an electronic product is accompanied by occurrence of an ESD phenomenon in an entire life cycle. When ESD occurs, a high voltage instantaneously generated breaks down a device in an IC, causing a chip to fail or to burn out.

To avoid the harm of the ESD to the IC, an electrostatic discharge protection device is usually provided in the IC, and the IC is protected by releasing electrostatic charges through a low impedance channel formed by the electrostatic discharge protection device. The electrostatic discharge protection device generally includes one or more of a resistor, a diode, a triode, a metal oxide semiconductor (MOS) transistor, or a semiconductor conductor rectifier (SCR). However, existing electrostatic discharge protection devices have a problem of high trigger voltage and are not suitable for electrostatic discharge protection of semiconductor devices such as a dynamic random access memory (DRAM).

SUMMARY

The present disclosure provides an electrostatic discharge protection device, including a first subdevice. The first subdevice includes: a first P-type heavily-doped region, a first N-type heavily-doped region, a second N-type heavily-doped region, a second P-type heavily-doped region, and a third N-type heavily-doped region. Both the first P-type heavily-doped region and the first N-type heavily-doped region are located in a P well, both the second P-type heavily-doped region and the third N-type heavily-doped region are located in a first N well, one part of the second N-type heavily-doped region is located in the P well, the other part of the second N-type heavily-doped region is located in the first N well, the P well is adjacent to the first N well, and both the P well and the first N well are located in a P-type substrate. The P-type substrate is provided with a gate structure, the gate structure is located between the first N-type heavily-doped region and the second N-type heavily-doped region, and the gate structure, the first N-type heavily-doped region, and the second N-type heavily-doped region form a transistor.

DETAILED DESCRIPTION

Figure 1:
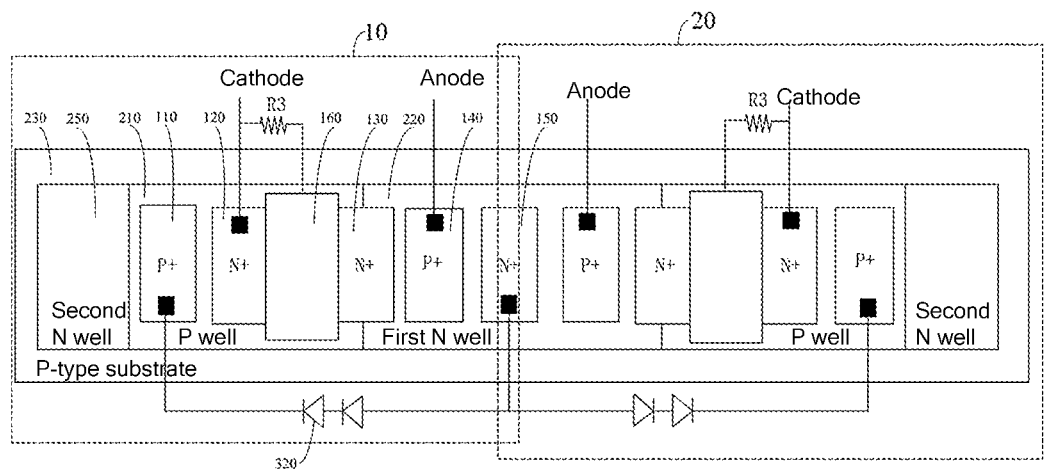
FIG. 1 is a layout diagram of an electrostatic discharge protection device according to an embodiment of the present disclosure.

Exemplary embodiments are described in detail herein, and examples thereof are represented in the accompanying drawings. When the following descriptions relate to the accompanying drawings, unless otherwise stated, same digitals in different accompanying drawings represent same or similar essential factors. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

The terms "includes" and "has" in the present disclosure are used to indicate an open-ended inclusion and to mean that additional elements/components/and the like may exist in addition to the listed elements/components/and the like. The terms "first", "second", and the like are merely used as markers, not as quantitative restrictions on objects thereof. In the present disclosure, in the absence of any description to the contrary, orientation terms such as "upper, lower, left, right" are usually used to refer to the upper, lower, left, and right as shown in the accompanying drawings. The "inside and outside" refers to the inside and outside relative to contour of each component. It can be understood that the foregoing orientation terms represent relative terms and are used in this specification for convenience only, for example, according to orientations in the examples described in the accompanying drawings, if a device of an icon is turned upside down, the components described as "upper" will become the "lower" components. In the accompanying drawings, shapes shown can be deformed depending on a manufacturing process and/or a tolerance. Therefore, the exemplary implementations of the present disclosure are not limited to the particular shapes illustrated in the accompanying drawings and may include changes in shape caused during a manufacturing process. In addition, the different elements and regions in the accompanying drawings are shown schematically only, and therefore the present disclosure is not limited to the sizes or distances shown in the accompanying drawings.

ESD phenomena often occur in IC products. ESD phenomena occur in various aspects of semiconductor devices or circuits, for example, a series of processes such as manufacturing, packaging, testing, and storage. An internal circuit of a semiconductor device is electrically connected to the outside through a pin. When the semiconductor device is exposed to an electrostatic environment, an instantaneous high voltage enters an inside of the semiconductor device, causing damage to the semiconductor device. Therefore, an electrostatic discharge protection device is provided inside a semiconductor device in the prior art.

However, a trigger voltage of the electrostatic discharge protection device in the prior art is usually high, and a breakdown voltage of a PN junction or gate oxide layer in an IC is lower than the trigger voltage. When in an electrostatic environment, the IC is damaged or burned before the electrostatic discharge protection device is triggered. Therefore, the trigger voltage of the electrostatic discharge protection device needs to be reduced to improve an electrostatic discharge protection capability of the electrostatic discharge protection device.

In view of the foregoing problems, an embodiment of the present disclosure provides an electrostatic discharge protection device. A transistor is formed in the electrostatic discharge protection device, and the transistor is conducted first, to discharge a part of an electrostatic current, thereby reducing the trigger voltage of the electrostatic discharge protection device and improving the electrostatic discharge protection capability of the electrostatic discharge protection device. A low impedance channel is formed in the electrostatic discharge protection device, to discharge most of the electrostatic current, thereby further improving the electrostatic discharge protection capability of the electrostatic discharge protection device.

Figure 2:
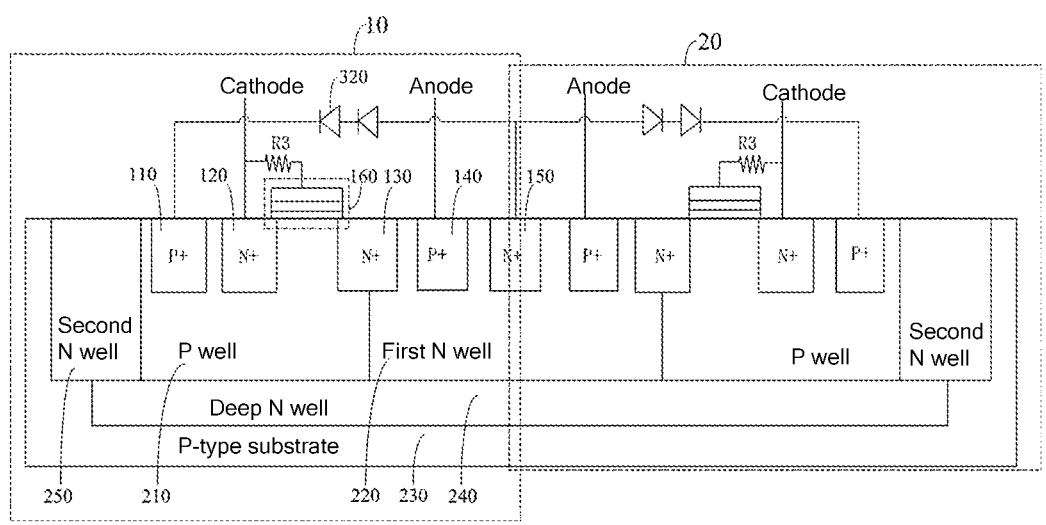
FIG. 2 is a schematic structural diagram of an electrostatic discharge protection device according to an embodiment of the present disclosure.

Refer to FIG. 1 and FIG. 2. FIG. 1 is a layout diagram of an electrostatic discharge protection device according to an embodiment of the present disclosure. FIG. 2 is a schematic structural diagram of an electrostatic discharge protection device according to an embodiment of the present disclosure. The electrostatic discharge protection device includes a first subdevice 10. The first subdevice 10 includes: a first P-type heavily-doped region 110, a first N-type heavily-doped region 120, a second N-type heavily-doped region 130, a second P-type heavily-doped region 140, and a third N-type heavily-doped region 150. The heavily-doped region is a region in which a large quantity of impurities are doped, that is, a doping concentration is high. The P-type heavily-doped region is referred to as P+ for short, and the N-type heavily-doped region is referred to as N+ for short.

As shown in FIG. 1 and FIG. 2, both the first P-type heavily-doped region 110 and the first N-type heavily-doped region 120 are located in a P well 210, both the second P-type heavily-doped region 140 and the third N-type heavily-doped region 150 are located in a first N well 220, and the P well 210 is adjacent to the first N well 220. As shown in FIG. 1 and FIG. 2, the P well 210 is located on a left side of the first N well 220. One part of the second N-type heavily-doped region 130 is located in the P well 210, and the other part of the second N-type heavily-doped region 130 is located in the first N well 220, that is, the second N-type heavily-doped region 130 straddles the P well 210 and the first N well 220. Both the P well 210 and the first N well 220 are located in a P-type substrate 230.

The P-type substrate 230 is a P-type semiconductor (hole-type semiconductor) substrate, and a material of the P-type substrate 230 may be silicon, germanium, gallium arsenide (GaAs), indium phosphide (InP), gallium nitride (GaN), or the like. The first N well 220 may be formed through implantation of N-type ions by busing an ion implantation process, and the P well 210 may be formed through implantation of P-type ions by using an ion implantation process.

As shown in FIG. 1 and FIG. 2, the second N-type heavily-doped region 130 is located between the first P-type heavily-doped region 110 and the second N-type heavily-doped region 130, and the second P-type heavily-doped region 140 is located between the second N-type heavily-doped region 130 and the third N-type heavily-doped region 150. Along a left-to-right direction in FIG. 2 and FIG. 3, in the first subdevice 10, the first P-type heavily-doped region 110, the first N-type heavily-doped region 120, the second N-type heavily-doped region 130, the second P-type heavily-doped region 140, and the third N-type heavily-doped region 150 are sequentially arranged.

In some possible examples of the present disclosure, both the P well 210 and the first N well 220 are located in a deep N well 240, and the deep N well 240 is located at the P-type substrate 230, for example, the deep N well 240 is formed by implanting N-type ions in the P-type substrate 230. The deep N well 240 is used to isolate the first subdevice 10 from another structure, to reduce mutual impact between the electrostatic discharge protection device and another structure.

As shown in FIG. 2, the depths of the P well 210 and the first N well 220 are less than that of the deep N well 240, that is, both the bottoms of the P well 210 and the first N well 220 are higher than that of the deep N well 240. For example, the P well 210 is formed by implanting P-type ions in some regions of the deep N well 240, and the first N well 220 is formed by continuing to implant N-type ions in the other regions of the deep N well 240. The third N-type heavily-doped region 150 and the second N-type heavily-doped region 130 in the first N well 220 may be formed by continuing to implant N-type ions in some regions of the first N well 220, and the second P-type heavily-doped region 140 in the first N well 220 may be formed by implanting P-type ions in some regions of the first N well 220. The first P-type heavily-doped region 110 in the P well 210 may be formed by continuing to implant P-type ions in some regions of the P well 210, and the first N-type heavily-doped region 120 and the second N-type heavily-doped region 130 in the P well 210 may be formed by implanting N-type ions in some regions of the P well 210.

In some other possible examples of the present disclosure, a second N well 250 is further provided on a side of the P well 210 far away from the first N well 220, the second N well 250 is adjacent to the P well 210, one part of the second N well 250 is located in the deep N well 240, and the other part of the second N well 250 is located in the P-type substrate 230. As shown in FIG. 2, a right side of the P well 210 is adjacent to the first N well 220, a left side of the P well 210 is adjacent to the second N well 250, and the second N well 250 straddles the deep N well 240 and the P-type substrate 230.

Figure 3:
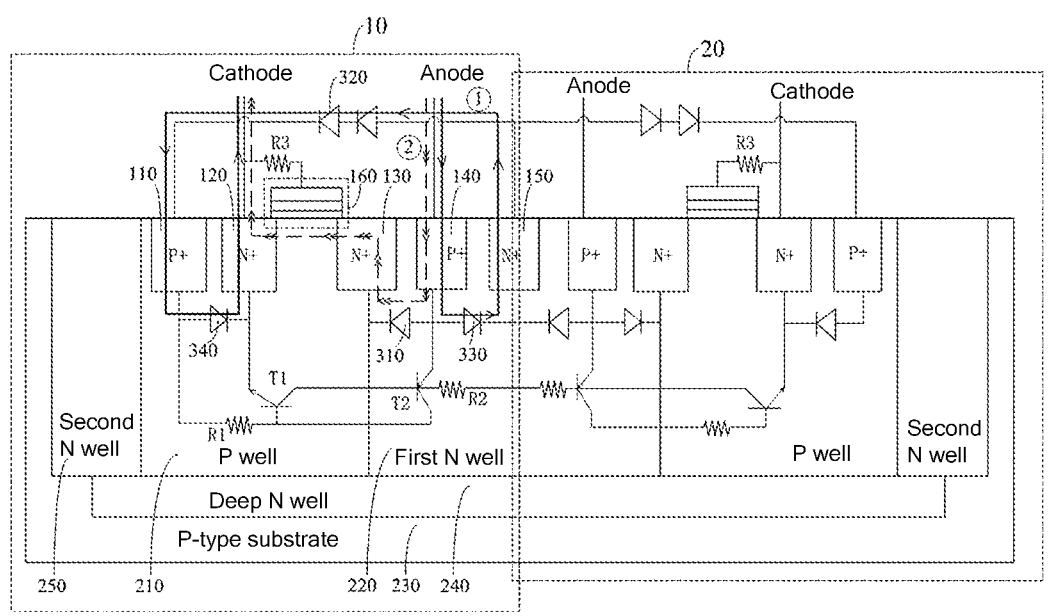
FIG. 3 is a diagram of a working principle of an electrostatic discharge protection device according to an embodiment of the present disclosure.

Refer to FIG. 3. The P well 210, the first N well 220, and the first N-type heavily-doped region 120 form a parasitic NPN-type transistor T1. The P well 210, the first N well 220, and the second P-type heavily-doped region 140 form a parasitic PNP-type transistor T2. The parasitic PNP-type transistor T2 and the parasitic NPN-type transistor T1 form a first discharge path.

The P well 210 has a first parasitic resistor R1. One terminal of the first parasitic resistor R1 is connected to a base of the parasitic NPN-type transistor T1. The base of the parasitic NPN-type transistor T1 is further connected to a collector of the parasitic PNP-type transistor T2. An emitter of the parasitic NPN-type transistor T1 is connected to a first voltage through the first N-type heavily-doped region 120. The first voltage is usually a cathode voltage.

The first N well 220 has a second parasitic resistor R2. One terminal of the second parasitic resistor R2 is connected to a base of the parasitic PNP-type transistor T2. The base of the parasitic PNP-type transistor T2 is further connected to a collector of the parasitic NPN-type transistor T1. The parasitic PNP-type transistor T2 is connected to a second voltage through the second P-type heavily-doped region 140. The second voltage is usually an anode voltage.

After an electrostatic current breaks down a PN junction formed by the first N well 220 and the P well 210, a current flows through the first N well 220, and a relatively large voltage difference occurs between the base and an emitter of the parasitic PNP-type transistor T2. After the voltage difference between the base and the emitter of the parasitic PNP-type transistor T2 is greater than a saturation breakover voltage of the parasitic PNP-type transistor T2, the parasitic PNP-type transistor T2 is conducted. A current of the collector of the parasitic PNP-type transistor T2 is fed back to the base of the parasitic NPN-type transistor T1, such that a relatively large voltage difference occurs between the emitter and the base of the parasitic NPN-type transistor T1. After the voltage difference between the emitter and the base of the parasitic NPN-type transistor T1 is greater than a saturation breakover voltage of the parasitic NPN-type transistor T1, the parasitic NPN-type transistor T1 is conducted, and the parasitic PNP-type transistor T2 and the parasitic NPN-type transistor T1 form the first discharge path, where the first discharge path is a low impedance path, such that an electrostatic current is discharged.

In addition, the parasitic PNP-type transistor T2 is a vertical transistor, the base is the first N well 220, and tens of times gains may be obtained from the base to the collector. The parasitic NPN-type transistor T1 is a side transistor, the base is the P well 210, and tens of times gains may be obtained from the base to the collector. The first discharge path has a relatively high discharge capability by using an amplification function of the parasitic PNP-type transistor T2 and the parasitic NPN-type transistor T1, such that the electrostatic discharge protection device in this embodiment of the present disclosure has a relatively strong electrostatic discharge protection capability.

It should be noted that, shallow trench isolation regions (not drawn in the figure) are separately provided between the first P-type heavily-doped region 110 and the first N-type heavily-doped region 120, between the second N-type heavily-doped region 130 and the second P-type heavily-doped region 140, and between the second P-type heavily-doped region 140 and the third N-type heavily-doped region 150. The shallow trench isolation regions include an insulating material (silicon oxide or silicon oxynitride), to insulate the foregoing heavily-doped regions. The tops of the shallow trench isolation regions are not lower than the top of the first P-type heavily-doped region 110, the first N-type heavily-doped region 120, the second N-type heavily-doped region 130, and the second P-type heavily-doped region 140, and the bottoms of the shallow trench isolation regions are lower than the bottom of the first P-type heavily-doped region 110, the first N-type heavily-doped region 120, the second N-type heavily-doped region 130, and the second P-type heavily-doped region 140, and is higher than the bottom of the first N well 220 and the P well 210.

Still refer to FIG. 1 and FIG. 2. The P-type substrate 230 is provided with a gate structure 160, the gate structure 160 is located between the first N-type heavily-doped region 120 and the second N-type heavily-doped region 130, and the gate structure 160, the first N-type heavily-doped region 120, and the second N-type heavily-doped region 130 form a transistor. The gate structure 160 is connected to a first voltage through the first resistor R3.

For example, the gate structure 160 includes an oxide layer (for example, a silicon oxide layer) provided on the P-type substrate 230, and a conductive layer (for example, a polycrystalline silicon layer) provided on the oxide layer. It can be understood that the gate structure 160, the first N-type heavily-doped region 120, and the second N-type heavily-doped region 130 form an N-metal-oxide-semiconductor (NMOS) transistor.

As shown in FIG. 3, the second P-type heavily-doped region 140 and the second N-type heavily-doped region 130 form a first diode 310, an anode of the first diode 310 is connected to the second P-type heavily-doped region 140, a cathode of the first diode 310 is connected to the second N-type heavily-doped region 130, and the first diode 310 and the transistor form a second discharge path. The second discharge path is represented by an arrow with a numeral 2 shown in FIG. 3. When an electrostatic current flows from the first diode 310 to the gate structure 160, the gate structure 160 is pulled up, such that a channel of the transistor is conducted, thereby discharging a part of the electrostatic current.

To further reduce the trigger voltage of the electrostatic discharge protection device, and improve the electrostatic discharge protection capability of the electrostatic discharge protection device, in some possible examples of the present disclosure, the first subdevice 10 of the electrostatic discharge protection device includes a second diode 320. As shown in FIG. 1 and FIG. 2, the second diode 320 is provided between the first P-type heavily-doped region 110 and the third N-type heavily-doped region 150, an anode of the second diode 320 is connected to the third N-type heavily-doped region 150, and a cathode of the second diode 320 is connected to the first P-type heavily-doped region 110.

As shown in FIG. 3, the second P-type heavily-doped region 140 and the third N-type heavily-doped region 150 form a third diode 330, an anode of the third diode 330 is connected to the second P-type heavily-doped region 140, and a cathode of the third diode 330 is connected to the third N-type heavily-doped region 150. The first P-type heavily-doped region 110 and the first N-type heavily-doped region 120 form a fourth diode 340, an anode of the fourth diode 340 is connected to the first P-type heavily-doped region 110, and a cathode of the fourth diode 340 is connected to the first N-type heavily-doped region 120. The third diode 330, the second diode 320, and the fourth diode 340 form a third discharge path. The third discharge path is represented by an arrow with a numeral 1 shown in FIG. 3, and the electrostatic current sequentially flows through the third diode 330, the second diode 320, and the fourth diode 340 and is discharged.

It should be noted that, a plurality of second diodes 320 may be provided, and the plurality of second diodes 320 are connected in series between the first P-type heavily-doped region 110 and the third N-type heavily-doped region 150, that is, a diode string is formed between the first P-type heavily-doped region 110 and the third N-type heavily-doped region 150.

In this embodiment of the present disclosure, when the electrostatic discharge protection device is located in an electrostatic environment, the second discharge path formed by the first diode 310 and the transistor, and the third discharge path formed by the third diode 330, the second diode 320, and the fourth diode 340 are usually conducted before the first discharge path formed by the parasitic PNP-type transistor and the parasitic NPN-type transistor, to discharge a part of the electrostatic current, thereby reducing the trigger voltage of the electrostatic discharge protection device, and improving the electrostatic discharge protection capability of the electrostatic discharge protection device. When the electrostatic discharge protection device is located in a normal environment, the gate structure 160 of the transistor has a low potential, and the second diode 320 is in a reverse cut-off state, not affecting normal work of a circuit protected by the electrostatic discharge protection device.

In some other possible examples of the present disclosure, the electrostatic discharge protection device further includes a second subdevice 20. The second subdevice 20 has a same structure as the first subdevice 10, and the second subdevice 20 and the first subdevice 10 are symmetrically distributed with respect to an axis of symmetry.

It can be understood that, the second subdevice 20 includes: a first P-type heavily-doped region, a first N-type heavily-doped region, a second N-type heavily-doped region, a second P-type heavily-doped region, and a third N-type heavily-doped region. Both the first P-type heavily-doped region and the first N-type heavily-doped region are located in a P well, both the second P-type heavily-doped region and the third N-type heavily-doped region are located in a first N well, and the P well is adjacent to the first N well. In addition, both the P well and the first N well are located in a P-type substrate, one part of the second N-type heavily-doped region is located in the P well, and the other part of the second N-type heavily-doped region is located in the first N well.

For example, the second N-type heavily-doped region is located between the first N-type heavily-doped region and the second P-type heavily-doped region, and the second P-type heavily-doped region is located between the second N-type heavily-doped region and the third N-type heavily-doped region. Along a right-to-left direction in FIG. 1 and FIG. 2, in the second subdevice 20, the first P-type heavily-doped region, the first N-type heavily-doped region, the second N-type heavily-doped region, the second P-type heavily-doped region, and the third N-type heavily-doped region are sequentially arranged.

In some possible examples of the present disclosure, both the P well and the first N well are located in a deep N well, and the deep N well is located on the P-type substrate. A second N well is further provided on a side of the P well far away from the first N well, the second N well is adjacent to the P well, one part of the second N well is located in the deep N well, and the other part of the second N well is located in the P-type substrate.

As shown in FIG. 1 and FIG. 2, the second subdevice 20 has the same structure as the first subdevice 10, to enable a discharge path in the second subdevice 20 to be consistent with a discharge path in the first subdevice 10, and ensure that the second subdevice 20 has a consistent feature with the first subdevice 10, such that the second subdevice 20 and the first subdevice 10 has a same trigger voltage. Therefore, the electrostatic current is more evenly discharged. The electrostatic discharge protection devices symmetrically distributed in the second subdevice 20 and the first subdevice 10 have a mutual protection capability, to improve an electrostatic discharge protection capability of the electrostatic discharge protection device, and avoid a damage caused by a reverse electrostatic current to the electrostatic discharge protection device. A working principle of the second subdevice 20 is the same as that of the first subdevice 10, and details are not described herein again.

The third N-type heavily-doped region 150 of the first subdevice 10 is located on a side of the first subdevice 10 close to the axis of symmetry, and the first subdevice 10 and the second subdevice 20 share the third N-type heavily-doped region 150. As shown in FIG. 1 and FIG. 2, the third N-type heavily-doped region 150 of the first subdevice 10 is integrated with the third N-type heavily-doped region 150 of the second subdevice 20, the first N well 220 of the first subdevice 10 is integrated with the first N well 220 of the second subdevice 20, the deep N well 240 of the first subdevice 10 is integrated with the deep N well 240 of the second subdevice 20, and the P-type substrate 230 of the first subdevice 10 is integrated with the P-type substrate 230 of the second subdevice 20. The first subdevice 10 and the second subdevice 20 are partially overlapped, such that a layout of the electrostatic discharge protection device is more compact. In this way, a layout area is further reduced while the electrostatic discharge protection capability of the electrostatic discharge protection device is improved.

In the electrostatic discharge protection device provided in the present disclosure, the gate structure 160, the first N-type heavily-doped region 120, and the second N-type heavily-doped region 130 form the transistor. When the electrostatic discharge protection device is located in the electrostatic environment, as the electrostatic current is increased, the PN junction formed by the second P-type heavily-doped region 140 and the P well 210 is broken down before the PN junction formed by the first N well 220 and the P well 210, that is, the transistor is first conducted, to discharge a part of the electrostatic current, thereby reducing the trigger voltage of the electrostatic discharge protection device, and improving the electrostatic discharge protection capability of the electrostatic discharge protection device. The PN junction formed by the first N well 220 and the P well 210 is broken down, and the second P-type heavily-doped region 140, the first N well 220, the P well 210, and the first N-type heavily-doped region 120 form a low impedance channel, to discharge most of the electrostatic current, thereby further improving the electrostatic discharge protection capability of the electrostatic discharge protection device.

The embodiments or implementations of this specification are described in a progressive manner, and each embodiment focuses on differences from other embodiments. The same or similar parts between the embodiments may refer to each other.

In the descriptions of this specification, the description with reference to the term "one implementation", "some implementations", "an exemplary implementation", "an example", "a specific example" or "some examples" means that a specific feature, structure, material or characteristic described in combination with the implementation(s) or example(s) is included in at least one implementation or example of the present disclosure. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the scope of the technical solutions of the embodiments of the present disclosure.

The invention claimed is:

1. An electrostatic discharge protection device, comprising a first subdevice, the first subdevice comprising: a first P-type heavily-doped region, a first N-type heavily-doped region, a second N-type heavily-doped region, a second P-type heavily-doped region, and a third N-type heavily-doped region;

wherein both the first P-type heavily-doped region and the first N-type heavily-doped region are located in a P well, both the second P-type heavily-doped region and the third N-type heavily-doped region are located in a first N well, one part of the second N-type heavily-doped region is located in the P well, a second part of the second N-type heavily-doped region is located in the first N well, the P well is adjacent to the first N well, and both the P well and the first N well are located in a P-type substrate; and the P-type substrate is provided with a gate structure, the gate structure is located between the first N-type heavily-doped region and the second N-type heavily-doped region, and the gate structure, the first N-type heavily-doped region, and the second N-type heavily-doped region form a transistor; and, wherein the first subdevice further comprises:
  a second diode, and the first P-type heavily-doped region is direct-connected to the third N-type heavily-doped region via the second diode, wherein an anode of the second diode is connected to the third N-type heavily-doped region, and a cathode of the second diode is connected to the first P-type heavily-doped region;
  the second P-type heavily-doped region and the third N-type heavily-doped region form a third diode, an anode of the third diode is connected to the second P-type heavily-doped region, and a cathode of the third diode is connected to the third N-type heavily-doped region;
  the first P-type heavily-doped region and the first N-type heavily-doped region form a fourth diode, an anode of the fourth diode is connected to the first P-type heavily-doped region, and a cathode of the fourth diode is connected to the first N-type heavily-doped region; and
  the third diode, the second diode, and the fourth diode form a third discharge path.

2. The electrostatic discharge protection device according to claim 1, wherein the first N-type heavily-doped region is connected to a first voltage, the second P-type heavily-doped region is connected to a second voltage, and the gate structure is connected to the first voltage through a first resistor.

3. The electrostatic discharge protection device according to claim 1, wherein the P well, the first N well, and the first N-type heavily-doped region form a parasitic NPN-type transistor; and
  the P well, the first N well, and the second P-type heavily-doped region form a parasitic PNP-type transistor, and the parasitic PNP-type transistor and the parasitic NPN-type transistor form a first discharge path.

4. The electrostatic discharge protection device according to claim 3, wherein the P well has a first parasitic resistor, one terminal of the first parasitic resistor is connected to a base of the parasitic NPN-type transistor, and the base of the parasitic NPN-type transistor is further connected to a collector of the parasitic PNP-type transistor.

5. The electrostatic discharge protection device according to claim 3, wherein the first N well has a second parasitic resistor, one terminal of the second parasitic resistor is connected to a base of the parasitic PNP-type transistor, and the base of the parasitic PNP-type transistor is further connected to a collector of the parasitic NPN-type transistor.

6. The electrostatic discharge protection device according to claim 1, wherein the second N-type heavily-doped region is located between the first N-type heavily-doped region and the second P-type heavily-doped region, and the second P-type heavily-doped region is located between the second N-type heavily-doped region and the third N-type heavily-doped region.

7. The electrostatic discharge protection device according to claim 1, wherein both the P well and the first N well are located in a deep N well, and the deep N well is located at the P-type substrate.

8. The electrostatic discharge protection device according to claim 7, wherein a second N well is further provided on a side of the P well away from the first N well, the second N well is adjacent to the P well, one part of the second N well is located in the deep N well, and a second part of the second N well is located at the P-type substrate.

9. The electrostatic discharge protection device according to claim 1, wherein the second P-type heavily-doped region and the second N-type heavily-doped region form a first diode, an anode of the first diode is connected to the second P-type heavily-doped region, a cathode of the first diode is connected to the second N-type heavily-doped region, and the first diode and the transistor form a second discharge path.

10. The electrostatic discharge protection device according to claim 1, wherein there are a plurality of the second diodes, and the plurality of the second diodes are connected in series between the first P-type heavily-doped region and the third N-type heavily-doped region.

11. The electrostatic discharge protection device according to claim 1, wherein the electrostatic discharge protection device further comprises a second subdevice, the second subdevice has a same structure as the first subdevice, and the second subdevice and the first subdevice are symmetrically distributed with respect to an axis of symmetry.

12. The electrostatic discharge protection device according to claim 11, wherein the third N-type heavily-doped region of the first subdevice is located on a side of the first subdevice close to the axis of symmetry, and the first subdevice and the second subdevice share the third N-type heavily-doped region.

\* \* \* \* \*